(12) United States Patent
Kobayashi

(10) Patent No.: US 7,817,511 B2
(45) Date of Patent: Oct. 19, 2010

(54) PHASE DIFFERENCE DETECTION CIRCUIT, PHASE DIFFERENCE DETECTING METHOD, OPTICAL DISK DRIVE, AND OPTICAL DISK DRIVE CONTROLLING METHOD

(75) Inventor: Kenji Kobayashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 1240 days.

(21) Appl. No.: 11/287,435

(22) Filed: Nov. 28, 2005

(65) Prior Publication Data

US 2006/0076982 A1    Apr. 13, 2006

(30) Foreign Application Priority Data

Dec. 8, 2004   (JP)   ............................. 2004-355730

(51) Int. Cl.
G11B 7/00   (2006.01)
(52) U.S. Cl. ................. 369/47.28; 369/53.34; 369/59.2
(58) Field of Classification Search ...................... None
See application file for complete search history.

(56) References Cited

U.S. PATENT DOCUMENTS

| | | | |
|---|---|---|---|
| 5,687,203 A | | 11/1997 | Baba |
| 6,741,668 B1 * | | 5/2004 | Nakamura ................. 375/372 |
| 6,829,295 B2 | | 12/2004 | Chao et al. |

FOREIGN PATENT DOCUMENTS

| | | |
|---|---|---|
| JP | 06-104740 | 4/1994 |
| JP | 8-237117 | 9/1996 |
| JP | 2001-273715 | 10/2001 |
| TW | 577992 | 3/2004 |

OTHER PUBLICATIONS

Taiwanese Office Action dated Aug. 31, 2006, with English translation.
Japanese Office Action dated Dec. 8, 2009 with a partial English Translation.

* cited by examiner

Primary Examiner—Jorge L Ortiz Criado
(74) Attorney, Agent, or Firm—McGinn IP Law Group, PLLC

(57) ABSTRACT

An embodiment of the present invention provides a phase difference detection circuit for detecting a phase difference between input data and an input clock generated based on the input data, including: an input data edge position detecting part detecting an edge position of the input data based on an N-phase clock obtained by dividing a predetermined period into N areas (N is an integer of 2 or more); an input clock edge position detecting part detecting an edge position of the input clock based on the input clock and the N-phase clock; and a phase difference detecting part detecting the phase difference between the input data and the input clock based on the edge position of the input data and an edge position of the input clock.

16 Claims, 9 Drawing Sheets

| | EDGE0 | EDGE1 | EDGE2 | EDGE3 | EDGE4 | EDGE5 | EDGE6 | EDGE7 | SIGN |
|---|---|---|---|---|---|---|---|---|---|
| | 1 | 0 | 0 | 0 | 0 | 0 | 0 | | 0 (000) |
| | 0 | 1 | 0 | 0 | 0 | 0 | 0 | 0 | 1 (001) |
| | 0 | 0 | 1 | 0 | 0 | 0 | 0 | 0 | 2 (010) |
| | 0 | 0 | 0 | 1 | 0 | 0 | 0 | 0 | 3 (011) |
| | 0 | 0 | 0 | 0 | 1 | 0 | 0 | 0 | 4 (100) |
| | 0 | 0 | 0 | 0 | 0 | 1 | 0 | 0 | 5 (101) |
| | 0 | 0 | 0 | 0 | 0 | 0 | 1 | 0 | 6 (110) |
| | 0 | 0 | 0 | 0 | 0 | 0 | 0 | 1 | 7 (111) |

FIG. 4

| SUBTRACTION RESULT | PHASE DIFFERENCE |
|---|---|
| 0 (000) | 0 (000) |
| 1 (001) | 1 (001) |
| 2 (010) | 2 (010) |
| 3 (011) | 3 (011) |
| 4 (100) | 4 (100) |
| 5 (101) | 3 (011) |
| 6 (110) | 2 (010) |
| 7 (111) | 1 (001) |

FIG. 5

PHASE DIFFERENCE DETECTION CIRCUIT, PHASE DIFFERENCE DETECTING METHOD, OPTICAL DISK DRIVE, AND OPTICAL DISK DRIVE CONTROLLING METHOD

BACKGROUND OF THE INVENTION

1. Field of the Invention

The present invention relates to a phase difference detection circuit, a phase difference detecting method, an optical disk drive, and an optical disk drive controlling method.

2. Description of Related Art

Nowadays, optical disks such as CD (compact disc) and DVD (digital versatile disc) have been widely available. In addition, new optical disks have been under development. Optical disk drives that read/write information from/to the optical disk amplify and shape signals read through light pick-up to supply read data to a PLL (phase locked loop) circuit. The PLL circuit generates a read clock synchronized with the read data. The read data is extracted in accordance with the synchronized read clock and subjected to signal processing to obtain final reproduction data.

At this time, attention should be paid to the fact that data read from the disk involves fluctuation in the time axis direction called "jitter". The jitter is caused by a reading device inclined with respect to a reading surface of the disk, that is, the optical axis of a reproducing laser beam not vertical to the disk surface, or the laser power inadequate for writing data. In some cases, correct signals cannot be input, leading to an error in reading data or correct data cannot be obtained due to the jitter.

Further, a read clock that is generated based on the read data with the jitter involves the jitter. In this case, an important problem is not the jitter in both the read data and the read clock but a relative phase difference. In such a case, even if the jitter of the read data is only detected without considering the jitter of the read clock, the detected jitter is different from a relative phase difference as a practical problem.

To that end, a method of detecting a jitter has been under study, and there have been some proposals. As the method of detecting the jitter, there has been proposed a method of inputting a read clock signal the rising/falling edge of which appears concurrently with that of the read data signal and detecting a delay therebetween with a counter (see Japanese Unexamined Patent Publication No. 2001-273715 (Kobayashi), for instance).

The related art disclosed in Kobayashi is discussed in brief. FIG. 10 shows the structure of a jitter detecting device of the related art. The jitter detecting device of the related art generates a read clock of which the edge is synchronous with that of the input read data by means of a PLL circuit 30, and a phase difference between the read data and the read clock is detected with a phase difference detection circuit 32.

The phase differential signal detected by the phase difference detection circuit 32 is output to a Schmitt circuit 33. The Schmitt circuit 33 compares the received phase difference with a threshold value preset by a threshold setting register 31, and sends, if the received phase difference exceeds the threshold value, this comparison result to a counter 34. The counter 34 increments a count value by 1 when the phase difference exceeds the threshold value.

The count value of the counter 34 is recorded in a register 35. The recorded value is output to a CPU through a CPU interface as needed. It is thus possible to count the number of times the phase difference exceeds the present threshold value.

With this method, however, the circuit is operated with reference to the edge of the read data signal, a delay of the read clock signal can be detected but the jitter of the advanced read clock signal cannot be detected. Further, the method only counts the number of times the threshold value is exceeded, thus it is impossible to evaluate the phase difference deviation of the rising edge and falling edge of the read data signal. It is still another problem that the jitter cannot be detected in consideration of the jitter of the read clock signal itself.

As mentioned above, the jitter detecting method using the conventional phase difference detection circuit is incapable of detecting the jitter of the advanced read clock signal. As another problem thereof, the jitter cannot be relatively detected in consideration of the influence of the jitter in the read clock signal itself.

SUMMARY OF THE INVENTION

An aspect of the present invention provides a phase difference detection circuit for detecting a phase difference between input data and an input clock generated based on the input data. An input data edge position detector detects an edge position of the input data based on an N-phase clock (N is an integer of 2 or more). An input clock edge position detector detects an edge position of the input clock based on the input clock and the N-phase clock. A phase difference detector detects the phase difference between the input data and the input clock based on the edge position of the input data and the edge position of the input clock. According to this circuit configuration, edge positions of both of input data and an input clock are detected, making it possible to obtain jitters of both of the input data and the input clock to calculate a relative jitter.

Another aspect of the present invention provides a phase difference detecting method for detecting a phase difference between input data and an input clock generated based on the input data. An edge position of the input data is detected based on an N-phase clock. An edge position of the input clock is detected based on the input clock and the N-phase clock. The phase difference between the input data and the input clock is detected based on the detected edge position of the input data and the detected edge position of the input clock. According to this method, edge positions of both of input data and an input clock are detected, making it possible to obtain jitters of both of the input data and the input clock to calculate a relative jitter.

According to the present invention, it is possible to provide a phase difference detection circuit capable of detecting edge positions of both input data and input clock to detect a jitter of the input data relative to a jitter of the input clock.

BRIEF DESCRIPTION OF THE DRAWINGS

The above and other objects, advantages and features of the present invention will be more apparent from the following description taken in conjunction with the accompanying drawings, in which:

FIG. 4 shows a relationship between edge values input to an edge position encoding circuit and output encoded-data according to the present invention;

FIG. 5 shows a relationship between a subtraction result and generated difference data according to the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment of the Invention

Figure 1:
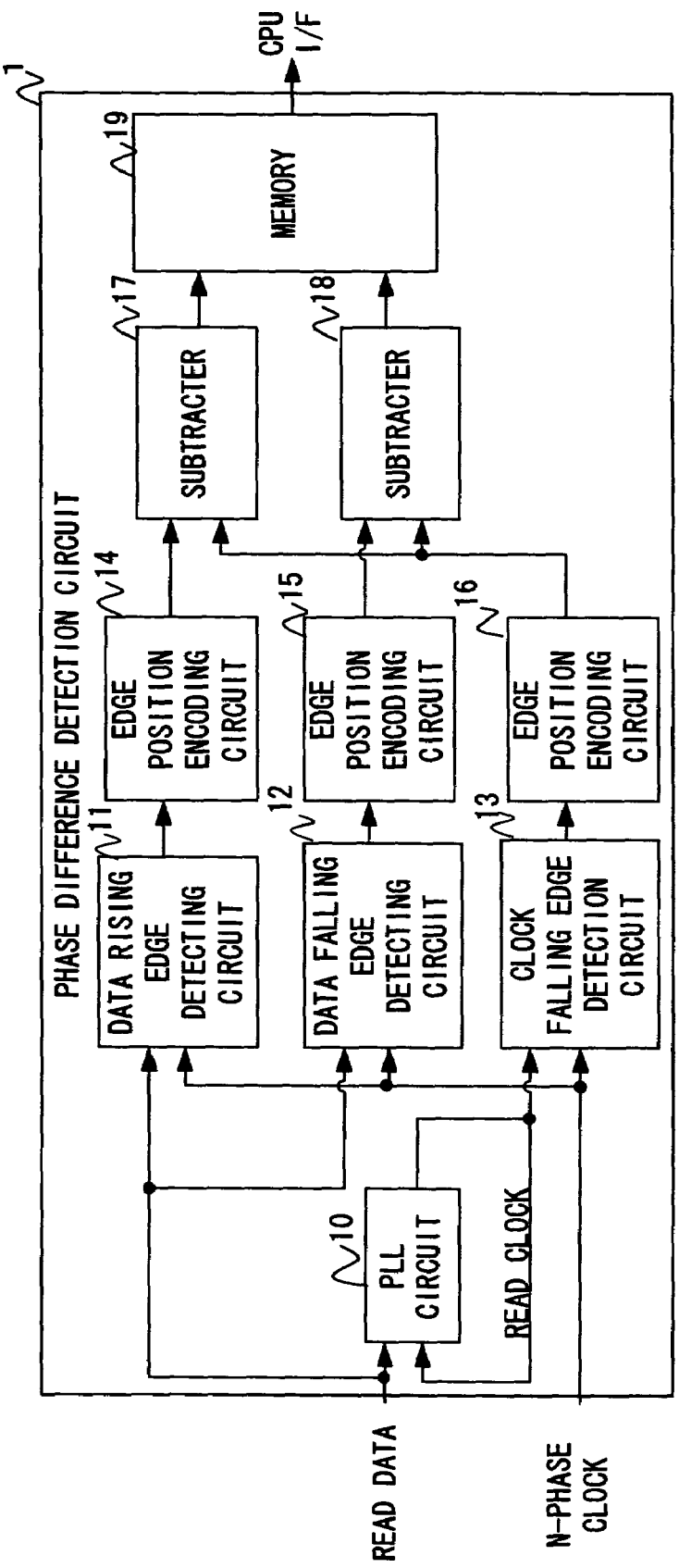
FIG. 1 is a block diagram showing the configuration of a phase difference detection circuit according to the present invention.

FIG. 1 shows the overall configuration of a phase difference detection circuit according to the present embodiment. A phase difference detection circuit 1 includes a PLL circuit 10, a data rising edge detection circuit 11, a data falling edge detection circuit 12, a clock falling edge detection circuit 13, edge position encoding circuits 14, 15, and 16, subtracters 17, 18, and a memory 19.

The PLL circuit 10 receives a read data signal to generate a read clock signal synchronous with the rising/falling edge of the received read data signal. The generated read clock signal is output to a clock falling edge detection circuit 13.

The data rising edge detection circuit 11 receives the read data signal and an N-phase clock signal to detect a rising edge position of the received read data signal with reference to the received N-phase clock signal. The N-phase clock signal consist of N types of signals having the same cycle as the read clock signal and the phases of which are shifted from one another by 360°/N. Here, N is an integer of 2 or more, preferably, 2 to the Mth power (M is an integer of 1 or more) such as 2, 4, 8, and 16. In the embodiment of the present invention, N=8. The method of detecting the edge based on the N-phase clock signal is detailed later. Information about the detected edge position is sent to the edge position encoding circuit 14.

The data falling edge detection circuit 12 receives the read data signal and the N-phase clock signal to detect a falling edge position of the received read data signal based on the received N-phase clock signal. Information about the detected edge position is output to the edge position encoding circuit 15.

The clock falling edge detection circuit 13 receives the read clock signal and the N-phase clock signal to detect the falling edge position of the received read clock signal based on the received N-phase clock signal. The read clock signal is generated by the PLL circuit 10. Information about the detected edge position is sent to the edge position encoding circuit 16.

The edge position encoding circuits 14, 15, and 16 encode the received information about the edge positions. An encoding method is described in detail later. The encoded data are output to the subtracters 17 and 18.

The subtracter 17 generates difference data of the edge position encoded data supplied from the edge position encoding circuits 14 and 16, and the subtracter 18 generates difference data of the edge position encoded data supplied from the edge position encoding circuits 15 and 16. The generated difference data are sent to the memory 19.

The memory 19 stores the difference data supplied from the subtracters 17 and 18. The stored difference data are output in response to a request from a CPU or other such units.

Figure 2:
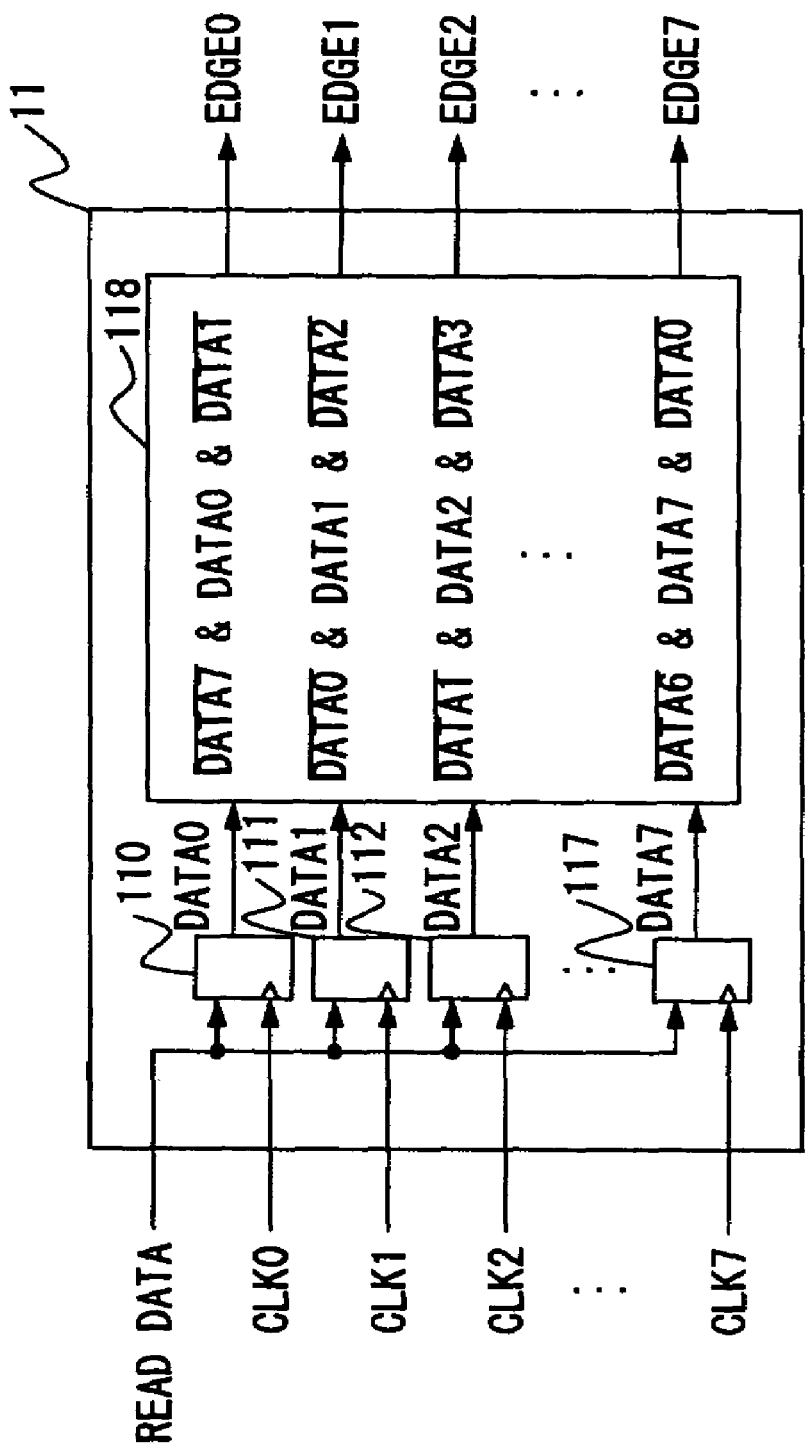
FIG. 2 is a block diagram showing the configuration of a data rising edge detection circuit according to the present invention.

Subsequently, a method of detecting a rising edge position of the read data signal with the data rising edge detection circuit 11 is described. FIG. 2 shows the configuration of the data rising edge detection circuit 11 according to the present invention. The data rising edge detection circuit 11 includes variation point detection circuits 110 to 117, and an arithmetic logical circuit 118.

Specifically, for example, the variation point detection circuit 110 receives a signal CLK0 of the N-phase clock signal, and determines whether or not the rising edge of the separately received read data signal falls within an area of the CLK0. If the determination result is positive, "1" is sent to the arithmetic logical circuit 118 as DATA0; otherwise, "0" is sent. The same applies to the remaining variation point detection circuits 111 to 117 except for the received signals of the N-phase clock signal.

The arithmetic logical circuit 118 executes arithmetic operation based on the respective data from the variation point detection circuits 110 to 117 to output the arithmetic operation result as EDGE0 to EDGE7. The arithmetic operation as illustrated in the arithmetic logical circuit 118 of FIG. 2 is executed. For example, EDGE0 is 1 when DATA0 is 1, and DATA7 and DATA1 are 0; otherwise, EDGE0 is 0. Similarly, each EDGE takes 1 only when corresponding DATA is 1, and adjacent DATA values are 0; otherwise, EDGE takes 0.

As describe above, the variation point detection circuits 110 to 117 each detects a logical level of the input data at each clock edge of the N-phase clock. The arithmetic logical circuit 118 determines the kth (k is an integer) clock of the N-phase clock as an edge timing of the input data if the kth variation point detection circuit detects HIGH and the (k−1)th and the (k+1)th detection circuits detect LOW.

Figure 3:
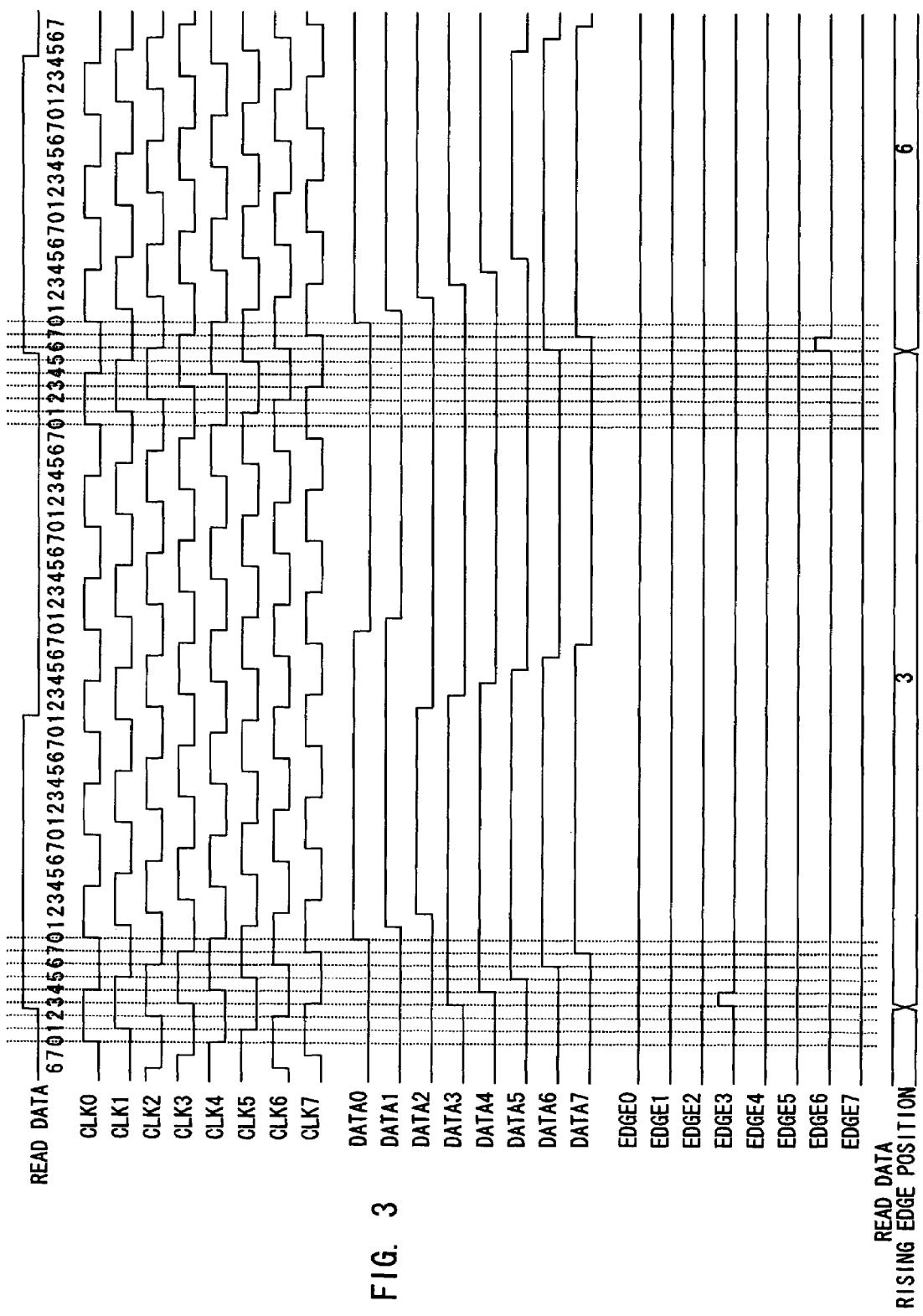
FIG. 3 is a timing chart showing rising/falling timings of read data and clock signals of read clock and N-phase clock according to the present invention.

Detailed description thereof is given taking a specific example. FIG. 3 is a timing chart showing timings of rising/falling edges of read data and signals of the N-phase clock signal. In the illustrated example of FIG. 3, the first rising edge of the read data appears between the rising edges of CLK2 and CLK3 of the N-phase clock. In this case, DATA3 and subsequent DATA's show pulse rises in sync with the rising edges of CLK3 and subsequent CLK's, and the values thereof are output from the variation point detection circuits 110 to 117 to the arithmetic logical circuit 118. Then, as a result of the logical operation of the arithmetic logical circuit 118, EDGE3 takes 1, and the remaining EDGE's take 0. Likewise, on the second rising edge, EDGE6 takes 1, and the remaining EDGE's take 0.

In this way, the data rising edge detection circuit 11 can determine an area where the rising edge of the target read data signal appears from among the areas divided according to the N-phase clock signal, and output the determination result as bit data.

The data falling edge detection circuit 12 and the clock falling edge detection circuit 13 have the same circuit configuration as the data rising edge detection circuit 11 except that the detecting position for the variation point is changed to the falling edge of the read data and the falling edge of the read clock data.

The edge positions detected with the data rising edge detection circuit 11, the data falling edge detection circuit 12, and the clock falling edge detection circuit 13 are sent as the bit data to the edge position encoding circuits 14, 15, and 16, respectively. The edge position encoding circuits 14, 15, and 16 encode the received bit data about the edge position.

FIG. 4 shows a relationship between the values of the EDGE0 to EDGE7 input to the edge position encoding circuits 14, 15, and 16 and the output encoded-data. The EDGE0 to EDGE7 can be encoded into 3-bit data since one of them is 1 and the rest are 0, which means 8 patterns in total.

The encoded data generated with the edge position encoding circuits 14, 15, and 16 are supplied to the subtracters 17 and 18, and the subtracters 17 and 18 generate difference data. The subtracter 17 generates difference data representative of a difference between rising edge position encoded data of the read data signal from the edge position encoding circuit 14 and falling edge position encoded data of the read clock signal from the edge position encoding circuit 16. The subtracter 18 generates difference data representative of a difference between falling edge position encoded data of the read data signal from the edge position encoding circuit 15 and falling edge position encoded data of the read clock signal from the edge position encoding circuit 16. As a result thereof, the relative difference data between the read data signal and the read clock signal can be obtained. Further, it is possible to deal with the case where the N-phase clock involves the jitter. For example, if the N-phase clock has the jitter of $\Delta$, the calculation is such that (read data edge+$\Delta$)−(read clock edge +$\Delta$)=(read data edge)−(read clock edge), so the jitter of the N-phase clock can be cancelled out.

FIG. 5 shows the relationship between the subtraction result and the generated difference data. When N=8, the maximum absolute value of the phase difference is 4. Thus, if the calculation result is 5, the absolute value of the phase difference is 3. If the subtraction result is 6, the absolute value of the phase difference is 2. If the subtraction result is 7, the absolute value of the phase difference is 1.

Figure 6:
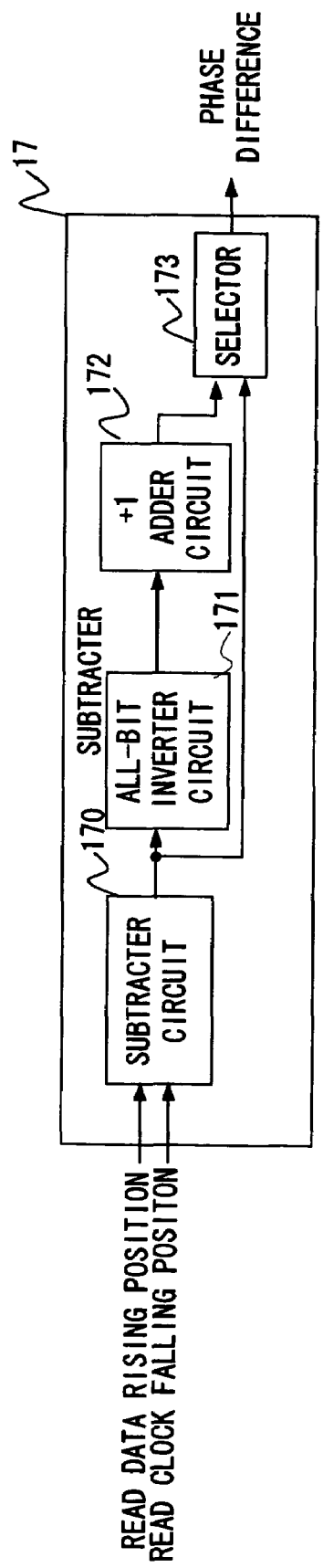
FIG. 6 is a block diagram showing the configuration of a subtracter according to the present invention.

If N is 2 to the Mth power (M is an integer of 1 or more) such as 8 or 16, the subtracters 17 and 18 can be configured as shown in FIG. 6. The subtracter 17 includes a subtracter circuit 170, an all-bit inverter circuit 171, a +1 adder circuit 172, and a selector 173.

The subtracter circuit 170 executes the subtraction processing on the received two encoded data about the edge position to send the subtraction result to the all-bit inverter circuit 171 and the selector 173. The all-bit inverter circuit 171 executes the bit-inversion on the received encoded data to output the bit-inverted data to the +1 adder circuit 172. The +1 adder circuit 172 adds 1 to the data supplied from the all-bit inverter circuit 171 to send the addition result to the selector 173. In the case of N=8, the selector 173 selects, if the subtraction result from the subtracter circuit 170 is 4 or less, the subtraction result received from the subtracter circuit 170, and selects, if the result is more than 4, the addition result received from the +1 adder circuit 172 to send the selected one to the memory 19. Provided that N=16, the selector 173 selects a desired one depending on whether or not the subtraction result is 8 or less.

Owing to such a circuit configuration, the subtracters 17 and 18 can send the phase difference calculated on the basis of the subtraction result of FIG. 5 to the memory 19.

The memory 19 stores the phase difference data received from the subtracters 17 and 18 as 3-bit data (if N=8). The stored phase difference data are read in response to a request from a CPU or other such units on the other end. There is no particular limitation on the application of the stored phase difference data.

Figure 7:
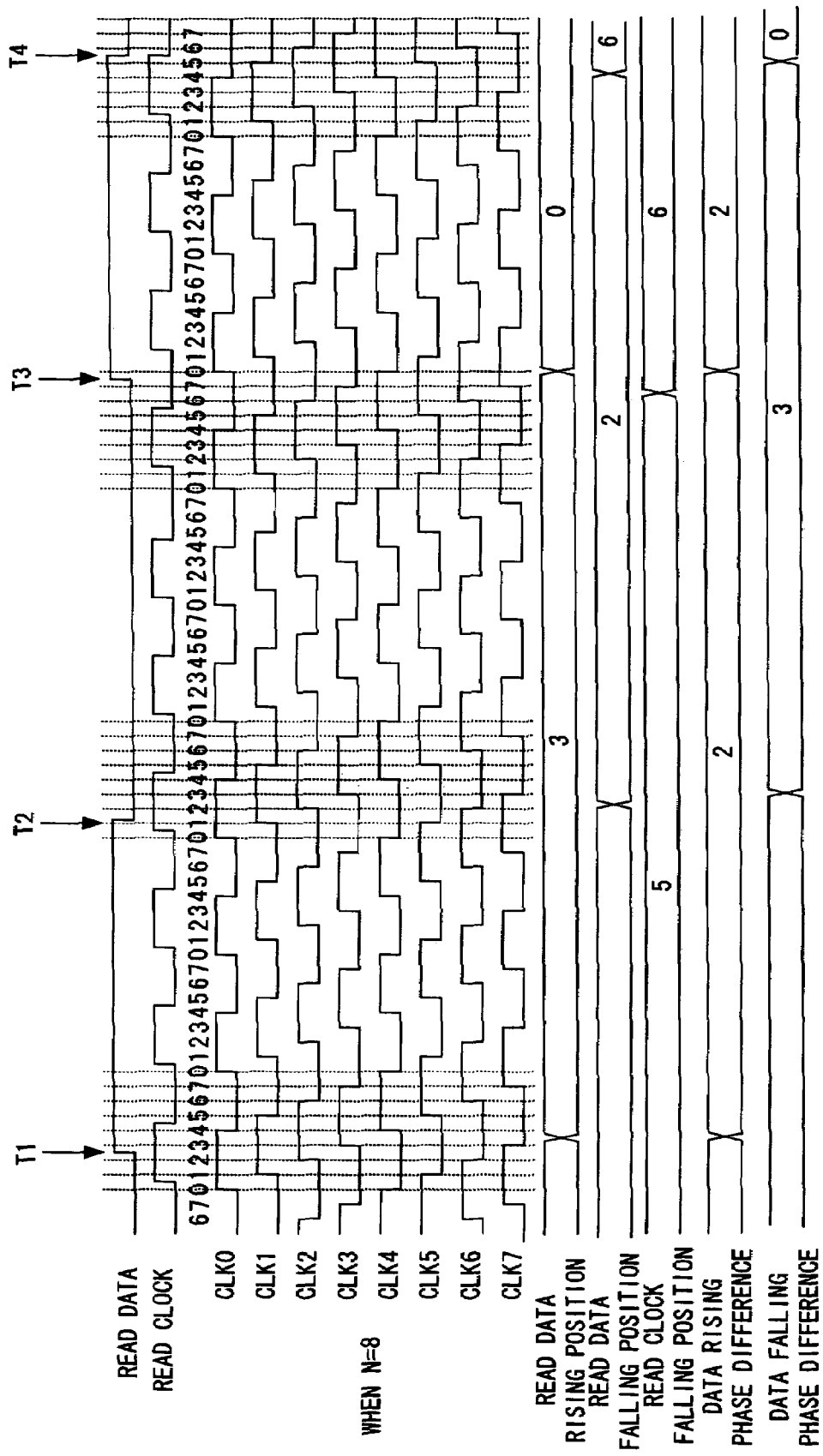
FIG. 7 is a timing chart showing a processing flow for a read data signal, a read clock signal, N-phase clock signal, detected edge positions, and output phase differences according to the present invention.

FIG. 7 is a timing chart showing a processing flow for a read data signal, a read clock signal, N-phase clock signal, detected edge positions, and output phase differences. On the first rising edge edgeT1 of the read data, the rising edge position is "3", and the corresponding falling edge position of the read clock is "5", so the phase difference equals "2". Likewise, on the first falling edgeT2 of the read data, the falling edge position is "2", and the corresponding falling edge position, which is different from the above corresponding falling edge position, of the read clock is "5", so the phase difference is "3".

On the second rising edgeT3 of the read data, the rising edge position is "0", and the corresponding falling edge position of the read clock is "6", so the difference equals −6, but the actual phase difference becomes "2" with the use of the subtracter 17. On the second falling edgeT4 of the read data, the falling edge position is "6", and the corresponding falling edge position of the read clock is "6", so the phase difference equals "0".

According to this configuration, the rising edge and the falling edge of the read data can be determined with respect to the falling edge of the read clock, so the phase difference reflecting the jitter of the read clock can be obtained. In addition, the phase difference is calculated separately on the rising edge and the falling edge, so more accurate phase difference data can be offered.

Second Embodiment of the Invention

Figure 8:
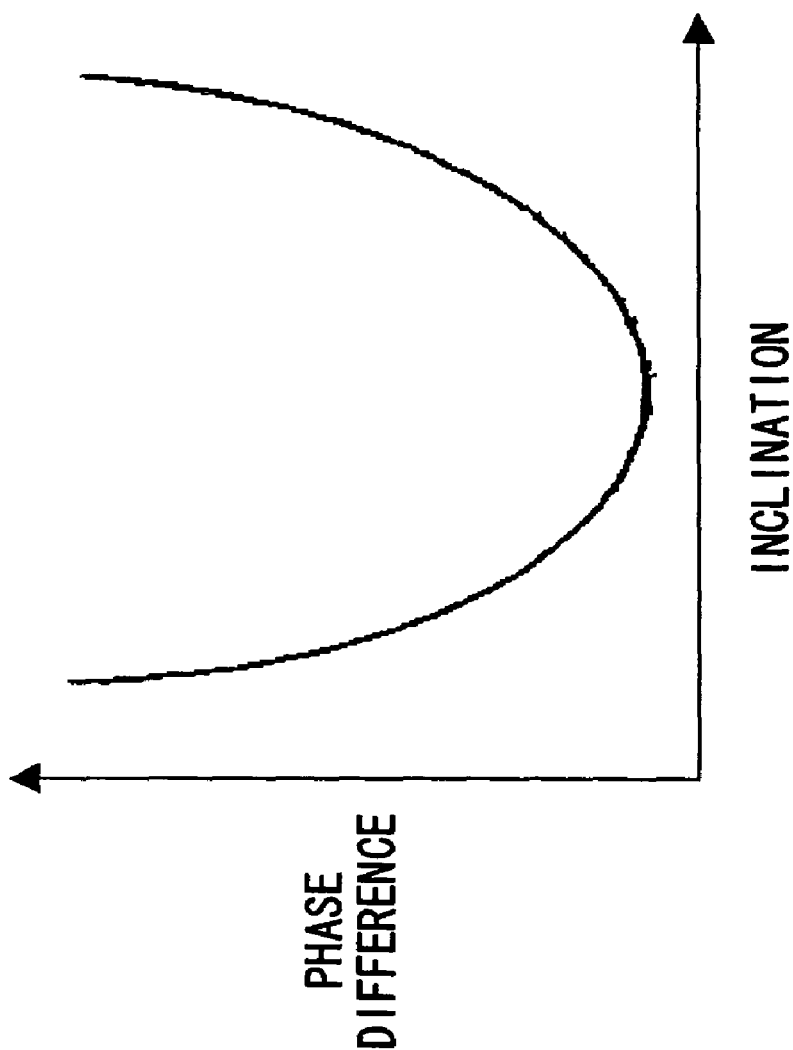
FIG. 8 is a graph showing a relationship between the inclination of an optical disk and a phase difference of a read data signal according to the present invention.

A description is given of an example in which the phase difference detection circuit of the present invention is applied to an optical disk device. The optical disk device is known to largely vary a phase difference of a read data signal upon, for example, data reproduction due to the inclination of a reading device with respect to a reading surface of the disk. FIG. 8 shows the relationship between the inclination of the reading device with respect to the reading surface of the disk, and the phase difference of the read data signal. To minimize the error resulting from the phase difference, it is necessary to find a point of the graph of FIG. 8, at which the phase difference is minimized. The phase difference detection circuit of the present invention is applicable to the optical disk device for that purpose.

Figure 9:
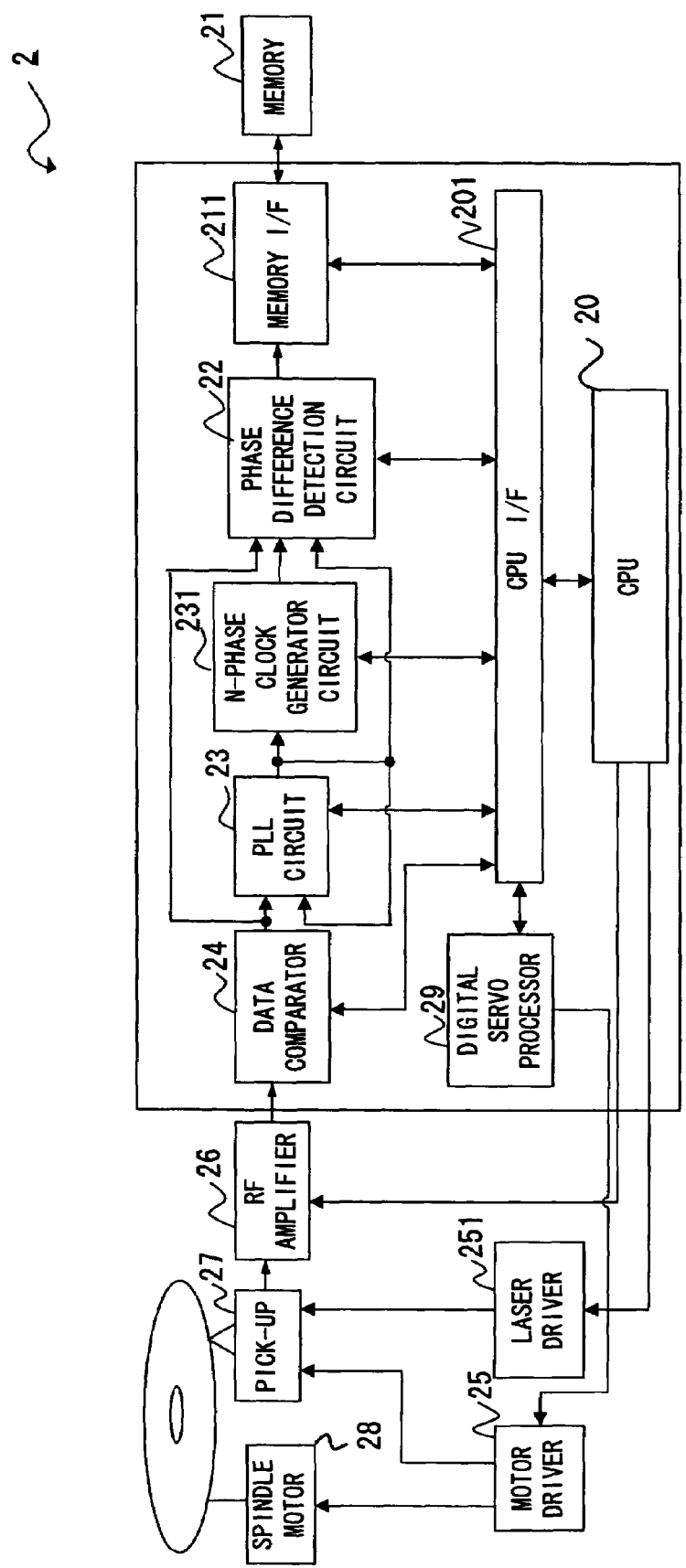
FIG. 9 is a block diagram showing the configuration of an optical disk device according to the present invention.
Figure 10:
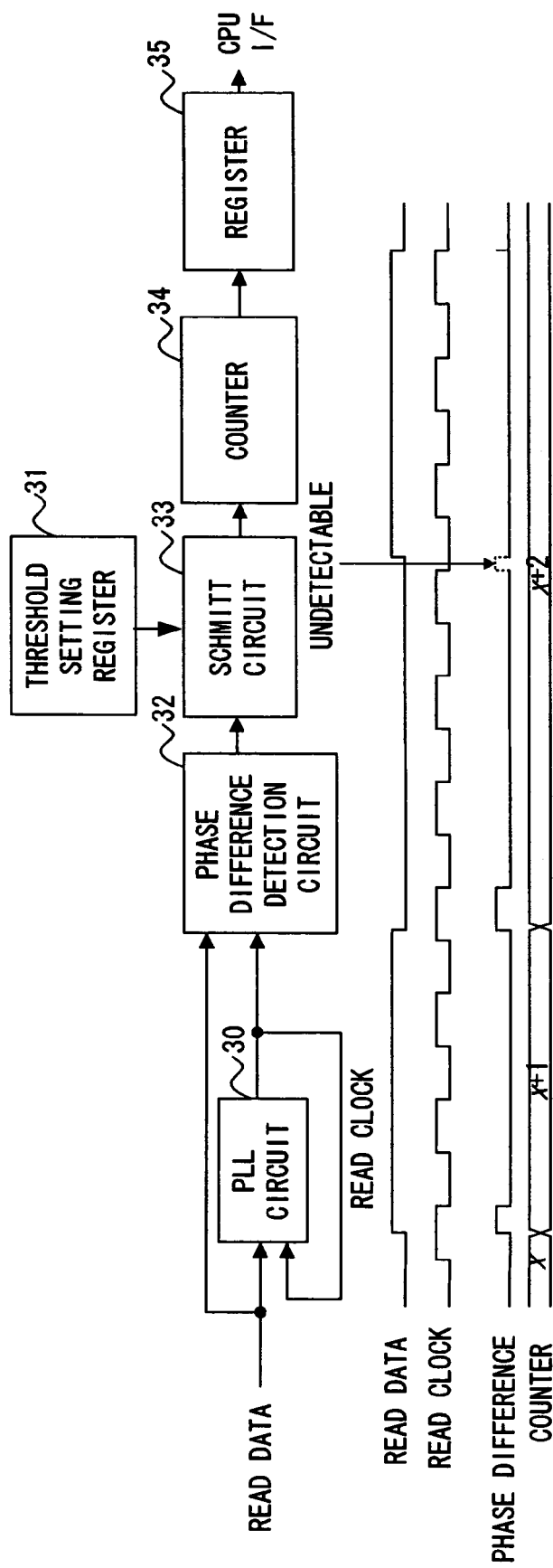
FIG. 10 shows the configuration of a jitter detecting device of the related art.

FIG. 9 is a schematic diagram focused on the structure related to the phase difference detection circuit of the present invention in the optical disk device of the present invention. The optical disk device 2 includes a CPU 20, a CPU interface 201, a memory 21, a memory interface 211, a phase difference detection circuit 22, a PLL circuit 23, an N-phase clock generator circuit 231, a data comparator 24, a motor driver 25, a laser driver 251, an RF amplifier 26, a pick-up 27, a spindle motor 28, and a digital servo processor 29.

The CPU 20 executes various types of control over the optical disk device 2. The CPU interface 201 controls the data exchange between the CPU 20 and the memory interface 211, the phase difference detection circuit 22, the PLL circuit 23, or the data comparator 24.

Programs for controlling the optical disk device 2 or various types of data are recorded/read on/from the memory 21. The memory interface 211 controls the data exchange among the memory 21, the CPU 20, and the phase difference detection circuit 22.

The phase difference detection circuit 22 detects the phase difference between the received read data signal and read data clock. The phase difference detection circuit has the same configuration as that of the first embodiment of the present invention as shown in FIG. 1, but the PLL circuit 10 of FIG. 1 may be replaced by the PLL circuit 23, and the memory 19 may be replaced by the memory 21, both of which may be omitted from the phase difference detection circuit 22 of the present invention. The phase difference detecting method is the same as the first embodiment of the present invention.

The PLL circuit 23 generates and outputs read clock signals based on the read data signal received from the data comparator 24 to the phase difference detection circuit 22 and the N-phase clock generator circuit 231.

The N-phase clock generator circuit 231 receives the read clock signal from the PLL circuit 23 to generate N-phase clock based on the received read clock signal. The N-phase clock generator circuit 231 sends the generated N-phase clock to the phase difference detection circuit 22.

The data comparator 24 slices the RF signals received from the RF amplifier 26 at a given slice level into binary data. This binary data is the read data signal. The generated read data signal is sent to the phase difference detection circuit 22 and the PLL circuit 23.

The motor driver 25 controls the rpm of the spindle motor 28 based on rotational servo signals supplied from the digital servo processor 29. Besides, the motor driver 25 controls the pick-up 27 based on a tracking servo signal and focus servo signal received from the digital servo processor 29.

The laser driver 251 controls the pick-up 27 based on the correction amount from the CPU 20 to adjust the laser power.

The RF amplifier 26 amplifies and applies the beam shaping to the signals received from the pick-up 27 to generate and send RF signals to the data comparator 24.

The pick-up 27 reads the data from the optical disk under the control of the motor driver 25 to send the read signal to the RF amplifier 26. The spindle motor 28 rotates the optical disk under the control of the motor driver 25.

The digital servo processor 29 generates and sends rotational servo signals, tracking servo signals, and focus servo signals to the motor driver 25 under the control of the CPU.

Subsequently, the application of the phase difference detected by the phase difference detection circuit 22 is described. The phase difference data supplied from the phase difference detection circuit 22 is stored in the memory 21. The phase difference data stored in the memory 21 is sent to the CPU 20, and the CPU 20 executes various types of control based on the phase difference data.

Examples of the control include, in addition to the foregoing adjustment of the inclination of the reading device with respect to the disk's reading surface, control of the laser power for writing the data to the optical disk. The data is written to the optical disk through turn on/off of the laser, so the laser power significantly influences the recording quality. Unless the optimum laser power is used, the obtained data of the read data signal is distorted, so the offset occurs on the edge. How far the data is distorted varies depending on the quality of the optical disk, so it is necessary to adjust the laser power so as to deal with various recording mediums. For that purpose, the phase difference detection circuit 22 detecting the deviation on the edge can be used.

The laser power is adjusted such that the CPU 20 sends the correction amount data to the laser driver 251 based on the received phase difference data. Receiving the correction amount data from the CPU 20, the laser driver 251 adjusts the laser power based on the correction amount data.

The phase difference data can be used for adjusting the RF signals. In this case, the CPU 20 adjusts the settings of a DC level of the RF amplifier 26, gain, or an output current of a driver.

Similarly, the correction amount data based on the phase difference is converted into analog data, enabling various types of control. In this case, the correction amount is sent to the digital servo processor 29 based on the phase difference data received from the CPU 20. The digital servo processor 29 converts the received correction amount data into analog data to be sent to the motor driver 25. The motor driver 25 controls the spindle motor 28 based on the received correction amount. Further, the motor driver 25 controls the pick-up 27 based on the received correction amount. In this way, the pick-up 27 and the spindle motor 28 are controlled, making it possible to control tracking or focusing processings or adjust the reading device with respect to the disk's reading surface based on the detected phase difference.

Other Embodiment of the Invention

In the above example, the phase difference data is recorded as the absolute value of 0 to 4 but may be recorded as a signed relative phase difference.

Further, in the above example, the N-phase clock is generated based on the input read clock data but maybe generated based on other clock generated inside an LSI or may be externally applied. In addition, the N-phase clock signal has N types of signals whose phases are shifted from one another by 360°/N. However, the degree of phase shift is not particularly limited insofar as it is determined which of N divided areas the edge appears in.

In addition, in the above example, the phase difference is calculated based on the falling edge of the read clock signal, the rising and falling edges of the read data signal but may be calculated based on the rising edge of the read clock signal, and the rising and falling edges of the read data signal.

It is apparent that the present invention is not limited to the above embodiment and it may be modified and changed without departing from the scope and spirit of the invention.

What is claimed is:

1. A phase difference detection circuit for detecting a phase difference between input data and an input clock generated based on the input data, comprising:
    an input data edge position detector detecting an edge position of the input data based on an N-phase clock, N is an integer of 2 or more;
    an input clock edge position detector detecting an edge position of the input clock based on the input clock and the N-phase clock; and
    a phase difference detector detecting the phase difference between the input data and the input clock based on the edge position of the input data and the edge position of the input clock.

2. The phase difference detection circuit according to claim 1, wherein the phase difference detector uses a difference between the edge position of the input data and the edge position of the input clock to detect the phase difference.

3. The phase difference detection circuit according to claim 1, wherein the input data edge position detector detects a rising edge and a falling edge of the input data, and the input clock edge position detector detects edges of the input clock,
    wherein the phase difference detector includes:
        a first subtracter calculating a difference between a rising edge of the input data detected with the input data edge position detector and an edge of the input clock detected with the input clock edge position detector; and a second subtracter calculating a difference between a falling edge of the input data detected with the input data edge position detector and an edge of the input clock detected with the input clock edge position detector, and wherein the difference calculated by the first subtracter and the difference calculated by the second subtracter are used to obtain the phase difference.

4. The phase difference detection circuit according to claim 1, wherein N of the N-phase clock is 2 to the Mth power, M being an integer of 1 or more, and the phase difference is obtained as M-bit encoded data.

5. The phase difference detection circuit according to claim 3, wherein N of the N-phase clock is 2 to the Mth power, M being an integer of 1 or more, and wherein the first and second subtracters comprises:
  a subtracting circuit for executing subtraction processing on received two encoded data about the edge positions;
  an all-bit inverter circuit for receiving a subtraction result from the subtracting circuit and executing bit-inversion on the received subtraction result to produce bit-inverted data;
  a +1 adder circuit for adding 1 to data supplied from the all-bit inverter circuit; and
  a selector for receiving the subtraction result from the subtracting circuit and an addition result from the +1 adder circuit, and for selecting the subtraction result if the subtraction result is N/2 or less and selecting the addition result if the result is more than N/2.

6. The phase difference detection circuit according to claim 1, wherein the input data edge position detector comprises:
  N detection circuits each of which detects a logical level of the input data at each clock edge of the N-phase clock, and
  a logic circuit determines the kth, k being an integer, clock of the N-phase clock as an edge timing of the input data if the kth detection circuit detects a first logic level and (k−1)th and (k+1)th detection circuits detect a second logic level.

7. An optical disk drive comprising the phase difference detection circuit according to claim 1.

8. The optical disk drive according to claim 7, further comprising:
  a memory storing a phase difference detected with the phase difference detection circuit; and a controller reading the phase difference from the memory to control reading data from an optical disk based on the read phase difference.

9. The optical disk drive according to claim 8, wherein the controller operates to minimize the phase difference which varies in accordance with an inclination of the reading device relative to a reading surface of an optical disk.

10. A phase difference detecting method for detecting a phase difference between input data and an input clock generated based on the input data, comprising:
  detecting an edge position of the input data based on an N-phase clock, N being an integer of 2 or more;
  detecting an edge position of the input clock based on the input clock and the N-phase clock; and
  detecting the phase difference between the input data and the input clock based on the detected edge position of the input data and the detected edge position of the input clock.

11. The phase difference detecting method according to claim 10, wherein said detecting the phase difference comprises calculating a difference between the edge position of the input data and the edge position of the input clock.

12. The phase difference detecting method according to claim 10, wherein the detecting of the input data edge position includes detecting a rising edge and a falling edge of the input data, and wherein the detecting of the input clock edge position includes detecting edges of the input clock, and the detecting of the phase difference includes calculating a difference between the detected rising edge of the input data and a first detected edge of the input clock, and calculating a difference between the detected falling edge of the input data and a second detected edge of the input clock, and wherein the difference between the rising edge of the input data and the edge of the input clock and the difference between the falling edge of the input data and the edge of the input clock are used to calculate the phase difference.

13. The phase difference detecting method according to claim 10, wherein N of the N-phase clock is 2 to the Mth power, M being an integer of 1 or more, and the phase difference is obtained as M-bit encoded data.

14. An optical disk drive controlling method for controlling reading data from an optical disk based on a phase difference detected with the phase difference detecting method according to claim 10.

15. The phase difference detection circuit according to claim 1, wherein the phase difference detector includes:
  a first subtracter for calculating a difference between a rising edge of the input data and and an edge of the input clock, and
  a second subtracter for calculating a difference between a falling edge of the input data and an edge of the input clock, and
  wherein said first and second subtracters comprises:
    a subtracting circuit for executing subtraction processing on received encoded data about the edge positions; and
    a selector for receiving the subtraction result from the subtracting circuit and selecting the subtraction result if the subtraction result is N/2 or less.

16. The phase difference detection circuit according to claim 15, wherein said first and second subtracters further comprise:
  an all-bit inverter circuit for receiving the subtraction result from the subtracting circuit and executing bit-inversion on the received subtraction result to produce bit-inverted data; and
  an a+1 adder circuit for adding 1 to data supplied from the all-bit inverter circuit; and
  wherein the selector receives the subtraction result from the subtracting circuit and an addition result from +1 adder circuit, and selects the subtraction result if the subtraction result is N/2 or less and selects the addition result if the result is more than N/2.

* * * * *